(12) United States Patent
Chen et al.

(10) Patent No.: US 11,910,556 B1
(45) Date of Patent: Feb. 20, 2024

(54) FASTENER WITH GEAR USAGE FOR TRAY INSTALL AND EJECT

(71) Applicant: Quanta Computer Inc., Taoyuan (TW)

(72) Inventors: Chao-Jung Chen, Taoyuan (TW); Kun-Pei Liu, Taoyuan (TW); Ming-Lun Ku, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 18/050,439

(22) Filed: Oct. 27, 2022

Related U.S. Application Data

(60) Provisional application No. 63/396,873, filed on Aug. 10, 2022.

(51) Int. Cl.
| | | |
|---|---|---|
| *H05K 7/14* | (2006.01) | |
| *G06F 1/16* | (2006.01) | |
| *G06F 1/18* | (2006.01) | |

(52) U.S. Cl.
CPC ......... *H05K 7/1489* (2013.01); *G06F 1/1679* (2013.01); *G06F 1/187* (2013.01)

(58) Field of Classification Search
CPC .... G06F 1/187; H05K 7/1409; H05K 7/1411; H05K 7/1487
See application file for complete search history.

(56) References Cited

U.S. PATENT DOCUMENTS

| | | | | |
|---|---|---|---|---|
| 3,453,586 A | * | 7/1969 | Brendlen, Jr. ... | H01R 13/62905 439/153 |
| 5,110,301 A | * | 5/1992 | Inoue ............... | H01R 13/62944 439/157 |
| 5,205,752 A | * | 4/1993 | Taguchi ........... | H01R 13/62905 439/157 |
| 5,325,263 A | * | 6/1994 | Singer ................ | H01R 13/6315 439/157 |
| 5,518,412 A | * | 5/1996 | Larabell ........... | H01R 13/62944 439/153 |
| 5,673,172 A | * | 9/1997 | Hastings ............... | H05K 7/1418 361/818 |
| 5,721,669 A | * | 2/1998 | Becker ................ | G11B 33/124 |
| 6,045,377 A | * | 4/2000 | Kajiura .................. | G06K 13/08 439/159 |
| 6,137,684 A | * | 10/2000 | Ayd ...................... | H05K 7/1411 361/608 |

(Continued)

*Primary Examiner* — Adrian S Wilson
(74) *Attorney, Agent, or Firm* — NIXON PEABODY LLP

(57) ABSTRACT

An example computing system includes an I/O module that is securable to the computer chassis. The I/O module includes a gear rack. In additional implementations, the computing system includes a fastening assembly which has a fastener configured to receive an external rotational force from a user. In other implementations, the fastening assembly includes a thread mechanism having first and second portions. The first portion of the thread mechanism are rotatably fixed to the fastener. In other implementations, the fastening assembly includes a gear rotatably fixed to the second portion of the thread mechanism, the gear being configured to engage a gear rack coupled to the I/O module. Upon receiving the external rotational force, the thread mechanism also causes (a) the gear to rotate and (b), in turn, linear movement of the gear rack to (c) secure or unsecure the I/O module relative to the computer chassis.

20 Claims, 12 Drawing Sheets

(56) References Cited

U.S. PATENT DOCUMENTS

| | | | | |
|---|---|---|---|---|
| 6,252,514 B1* | 6/2001 | Nolan | G11B 33/128 | |
| | | | 361/170 | |
| 6,549,424 B1* | 4/2003 | Beseth | H05K 7/1409 | |
| | | | 361/801 | |
| 6,891,728 B1* | 5/2005 | Mease | G06F 1/183 | |
| | | | 361/679.02 | |
| 6,912,124 B2* | 6/2005 | Megason | H05K 7/1409 | |
| | | | 361/679.02 | |
| 7,684,179 B1* | 3/2010 | Lima | H05K 7/1411 | |
| | | | 361/732 | |
| 7,791,865 B2* | 9/2010 | Wirtzberger | H05K 7/1457 | |
| | | | 361/728 | |
| 7,967,269 B2* | 6/2011 | Liu | F16M 13/02 | |
| | | | 248/316.4 | |
| 8,405,966 B2* | 3/2013 | Hartman | G06F 1/186 | |
| | | | 361/726 | |
| 9,030,827 B2* | 5/2015 | Jau | H05K 7/1487 | |
| | | | 211/49.1 | |
| 9,036,341 B2* | 5/2015 | Szelong | G06F 1/18 | |
| | | | 361/679.33 | |
| 9,703,333 B1* | 7/2017 | Harting | G06F 1/187 | |
| 9,706,688 B2* | 7/2017 | Smith | G06F 1/185 | |
| 10,939,574 B2* | 3/2021 | Wu | H05K 7/1489 | |
| 11,126,230 B1* | 9/2021 | Chen | G06F 1/181 | |
| 11,558,971 B2* | 1/2023 | Chen | H05K 7/1487 | |
| 11,596,069 B2* | 2/2023 | Chen | H01R 12/82 | |
| 2002/0104396 A1* | 8/2002 | Megason | F16H 51/00 | |
| | | | 439/157 | |
| 2003/0117779 A1* | 6/2003 | Gough | H05K 7/1488 | |
| | | | 361/728 | |
| 2005/0174743 A1* | 8/2005 | Downing | H05K 7/1409 | |
| | | | 361/725 | |
| 2006/0171110 A1* | 8/2006 | Li | G11B 33/128 | |
| 2007/0206351 A1* | 9/2007 | Szelong | G06F 1/187 | |
| | | | 361/829 | |
| 2012/0127658 A1* | 5/2012 | Hartman | G06F 1/187 | |
| | | | 29/428 | |
| 2016/0064040 A1* | 3/2016 | Hartman | H05K 7/1402 | |
| | | | 360/97.12 | |
| 2020/0396858 A1* | 12/2020 | Wu | H05K 7/1489 | |
| 2023/0034074 A1* | 2/2023 | Chen | H05K 1/148 | |
| 2023/0387629 A1* | 11/2023 | Chen | H01R 13/62961 | |

* cited by examiner

FASTENER WITH GEAR USAGE FOR TRAY INSTALL AND EJECT

CROSS-REFERENCE TO RELATED APPLICATIONS

This application claims priority from and benefit of U.S. Provisional Patent Application Ser. No. 63/396,873, filed on Aug. 10, 2022, titled "Fastener With Gear Usage For Tray Install and Eject," which is hereby incorporated by reference herein in its entirety.

TECHNICAL FIELD

The present disclosure relates generally to housing mechanisms for expansion components for computing devices. More particularly, aspects of this disclosure relate to a bay with a rotating fastener knob that allows for simple and quick release of an Input/Output (I/O) module having expansion components for a computing device chassis.

BACKGROUND

Computer systems (e.g., desktop computers, blade servers, rack-mount servers, etc.) are employed in large numbers in various applications. High demand applications, such as network based systems, data centers, or high density finite element simulations that are able to push hardware of computing systems, require servers with specialized capabilities. Accordingly, modern servers are typically designed to allow flexibility in terms of capabilities and components.

One way to add flexibility is to design expansion bays that allow components such as cards, storage devices, processor boards, etc., to be easily installed and enhance the basic capability of the server. An expansion bay will typically include trays that may support modular components. In order to ensure easy serviceability and the ability to change components, many trays may be accessed without having to move the actual server chassis to access the components. For example, certain trays may slide out from the chassis, allowing the installation or removal of a component. Once installation is complete, the tray may be pushed back into the chassis.

However, conventional implementations of component trays require a series of mechanical mechanisms to ensure that the trays are locked into place. For example, certain trays have rotatable levers that allow an operator to move the lever to an open position, thereby allowing for the tray to be slid out from the chassis and accessed. When the tray is loaded, it is pushed into the chassis, and the lever is rotated to the closed position. While simple in theory, these conventional lever mechanisms are complex and ultimately do not allow for easy access to the tray, particularly in limited space.

Thus, there is a need for a mechanism that allows a tray (also referred to herein as a "module") having expansion components to be easily released from a computer chassis. There is a further need for a mechanism for holding an I/O module that is mechanically simple and space efficient.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

An example computing system for securing an I/O module to a computer chassis is disclosed. In some implementations, the computing system includes an I/O module that is securable to the computer chassis. The I/O module includes a gear rack, and is movable in a translational direction relative to the computer chassis. In additional implementations, the computing system includes a fastening assembly which has a fastener configured to receive an external rotational force from a user. In other implementations, the fastening assembly includes a thread mechanism having first and second portions. The first portion of the thread mechanism are rotatably fixed to the fastener. In other implementations, the fastening assembly includes a gear rotatably fixed to the second portion of the thread mechanism, the gear being configured to engage a gear rack coupled to the I/O module. Upon receiving the external rotational force, the thread mechanism also causes (a) the gear to rotate and (b), in turn, linear movement of the gear rack to (c) secure or unsecure the I/O module relative to the computer chassis.

A further implementation of the example fastener assembly is where the fastener is configured to be rotated in a clockwise direction and a counterclockwise direction. In another implementation, the thread mechanism is configured to transfer external rotational force such that the I/O module moves linearly in a first direction in which the I/O module is secured relative to the computer chassis. In another implementation, the thread mechanism is configured to transfer external rotational force such that the I/O module moves linearly in a second direction in which the I/O module is unsecured relative to the computer chassis. The first direction may be opposite and parallel to the second direction. Moreover, the first and second directions are perpendicular to a plane of rotation of the fastener.

In another implementation, patterned features of the gear are configured to engage corresponding patterned features of the gear rack. In another implementation, a length of the gear rack is between about 2 centimeters and about 15 centimeters. In still other implementations, the fastener is rotatably fixed to an exterior of the chassis. In other implementations, the I/O module is configured to slide in and out of a bay in the chassis in response to external linear forces being applied to the I/O module while the gear is not engaged with the gear rack. In still other implementations, the gear and thread mechanism are configured to prevent the I/O module from sliding in and out of the bay in the chassis in response to external linear forces being applied to the I/O module while the gear is engaged with the gear rack.

An example system is also disclosed which includes a computer device chassis having bays, each bay configured to receive and secure an I/O module having a gear rack. The system also includes fastening assemblies, each fastening assembly including a fastener configured to receive an external rotational force from a user. Each fastening assembly further includes a thread mechanism having first and second portions. The first portion of the thread mechanism is rotatably fixed to the fastener. Each fastening assembly also includes a gear rotatably fixed to the second portion of the thread mechanism, where the gear is configured to engage the gear rack coupled to the I/O module. Moreover, the first portion of the thread mechanism has a first axis of rotation, while the gear has a second axis of rotation that is generally perpendicular to the first axis of rotation. Upon receiving the external rotational force, the thread mechanism also causes (a) the gear to rotate and (b), in turn, linear movement of the gear rack to (c) secure or unsecure the I/O module relative to the computer chassis.

An example method of securing an I/O module in a bay of a computer chassis includes inserting the I/O module in the bay of the chassis such that a gear rack coupled to the I/O module comes into contact with a gear. The I/O module is movable in a translational direction along the bay relative to the computer chassis. The gear is also configured to engage the gear rack. The method further includes applying an external rotational force to a fastener. The fastener is rotatably fixed to a first portion of a thread mechanism, and a second portion of the thread mechanism is rotatably fixed to the gear. Moreover, the first portion has a first axis of rotation, while the gear has a second axis of rotation that is generally perpendicular to the first axis of rotation. Upon receiving the external rotational force, the thread mechanism also causes (a) the gear to rotate and (b), in turn, linear movement of the gear rack to (c) secure or unsecure the I/O module relative to the computer chassis. The method additionally includes removing the external rotational force from the fastener in response to the I/O module being secured. In one implementation, a face of the I/O module is flush with a face of the chassis while the I/O module is secured to the chassis.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
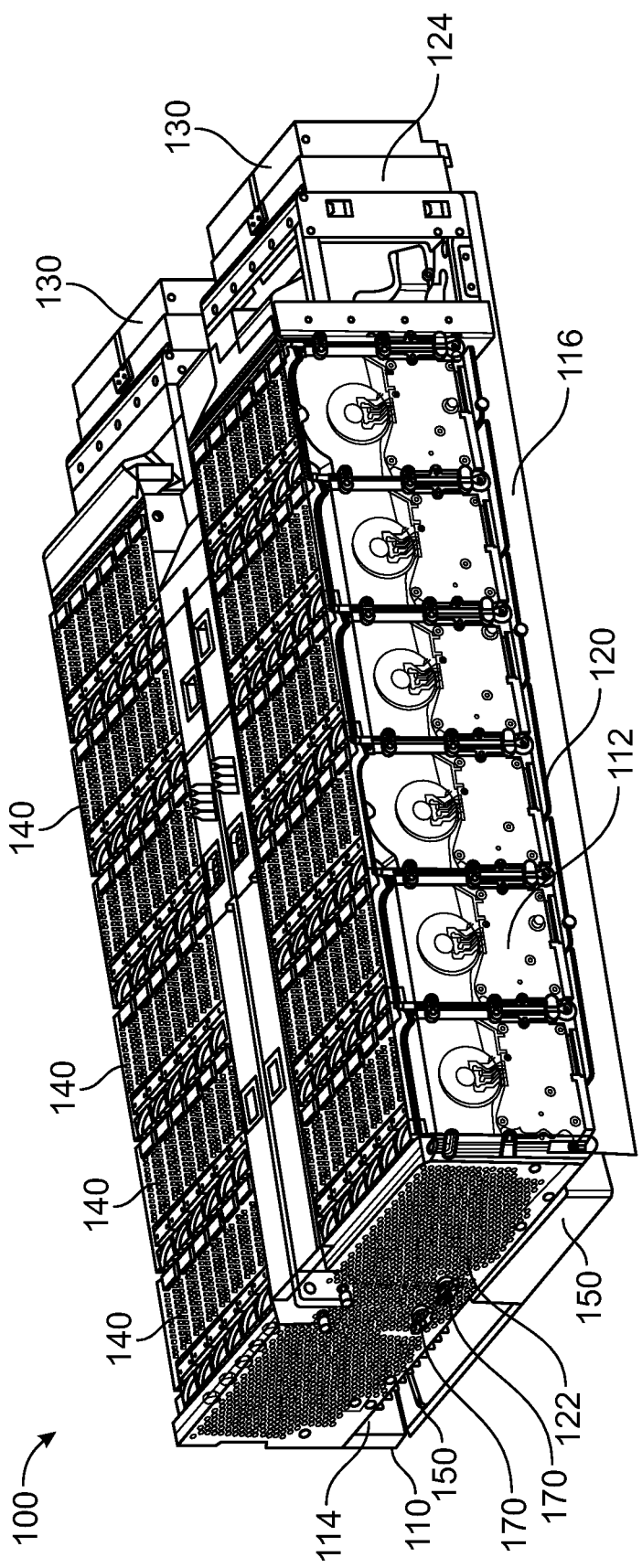
FIG. 1A is a perspective view of a computer system with module structures for holding expansion devices, according to aspects of the present disclosure.

The present disclosure is directed toward a fastening assembly for securing an I/O module (also referred to herein as an "I/O tray") to a computer device chassis is disclosed. The fastening assembly includes a fastener, and a thread mechanism having first and second portions. The first portion of the thread mechanism are rotatably fixed to the fastener. The fastening assembly further includes a gear rotatably fixed to the second portion of the thread mechanism, the gear being configured to engage a gear rack coupled to the I/O module. The thread mechanism is also configured to transfer an external rotational force applied to the fastener, the external rotational force being transferred to the gear rack and I/O module via the gear.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical", "horizontal", "parallel", and "perpendicular" are intended to additionally include "within 3-5% of" a vertical, horizontal, parallel, or perpendicular orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1B:
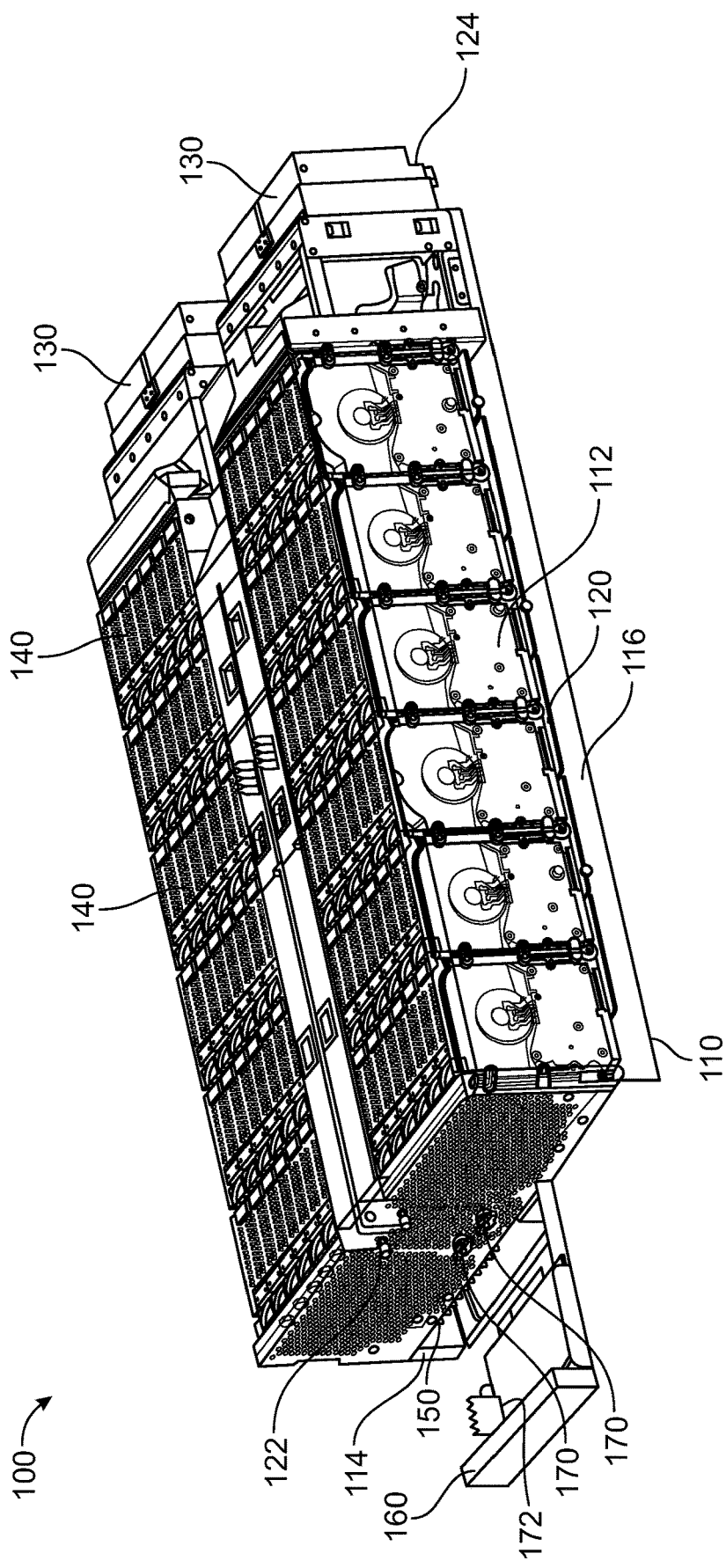
FIG. 1B is a perspective view of a computer system with an open module structure for holding an expansion device, according to aspects of the present disclosure.
Figure 1C:
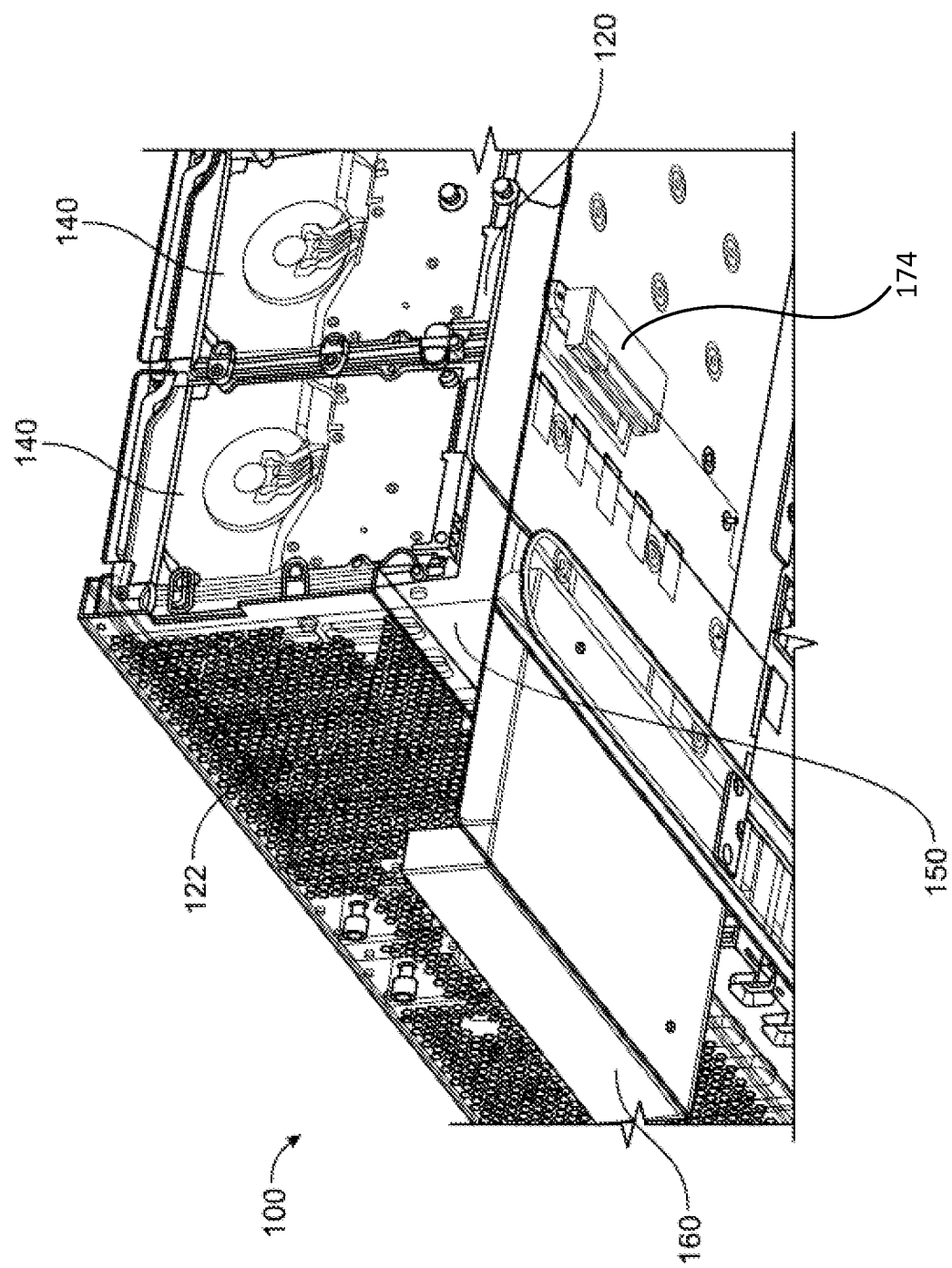
FIG. 1C is an isolated bottom perspective view of the fastening assembly with an I/O module partially inserted in a bay of the computer system of FIG. 1A, according to aspects of the present disclosure.

FIGS. 1A-1C depict a storage server 100, in accordance with one embodiment. As an option, the present storage server 100 may be implemented in conjunction with features from any other embodiment listed herein, such as those described with reference to the other FIGS. However, such storage server 100 and others presented herein may be used in various applications and/or in permutations which may or may not be specifically described in the illustrative embodiments listed herein. Further, the storage server 100 presented herein may be used in any desired environment. Thus FIGS. 1A-1C (and the other FIGS.) may be deemed to include any possible permutation.

The storage server 100 is shown as having the bay 150 adjacent side wall 114 as being empty. In other words, the bay 150 adjacent side wall 114 does not have an I/O module secured (e.g., included) therein. Accordingly, this empty bay 150 is available to receive an I/O module 160 (also referred to herein as an "expansion module"). The I/O module 160 may include any number and/or type of expansion components included therein, e.g., to supplement the functionality of the computer chassis in which the I/O module 160 is implemented. Accordingly, the I/O module 160 may conform to a specific card form factor design in some implementations. For example, the I/O module 160 may have a peripheral component interconnect express (PCIe) compliant form factor. The I/O module 160 may thereby be implemented with other components having the same or similar form factors.

While one of the bays 150 is empty as mentioned above, the bay 150 adjacent side wall 112 has an I/O module 160 already inserted therein. The bays 150 preferably include a fastening assembly that allows an I/O module 160 to be inserted and secured therein. The fastening assembly utilizes a rotatable fastener knob 170 to selectively secure and release the I/O module 160 from the bay 150 in the storage server 100. This allows for the I/O modules to be easily removed and replaced, even in implementations having limited available space. Accordingly, adjusting the fastening assembly allows for the I/O module 160 to be secured or released, e.g., as will be described in further detail below.

Looking specifically now to FIG. 1A, a perspective view of the storage server 100 is illustrated. Depending on the implementation, the storage server 100 may be a computer system, a computer device, etc. As shown, the storage server 100 includes a chassis 110 with two side walls 112 and 114. The side walls 112 and 114 are joined by a bottom panel 116. A motherboard 120 is mounted between the side walls 112 and 114. The motherboard 120 is fixed between a front panel 122 and a rear panel 124 of the chassis 110. The motherboard 120 includes one or more components such as power supplies, processors (e.g., CPUs), network interface cards, memory devices, etc.

A set of fan modules 130 are also located towards a rear of the chassis 110. According to some approaches, the fan modules 130 are coupled to a back surface of the chassis 110, the back surface being on an opposite side of the chassis 110 than a front surface having the front panel 122 formed thereon. The fan modules 130 are configured and positioned in the storage server 100 to generate air flow between the side walls 112 and 114. This generated air flow assists in cooling the components of the storage server 100. The fan modules 130 are further configured to set a direction for the incoming air flow and the outgoing air flow, such that both the incoming air flow and the outgoing air current flow move in a same direction.

According to the present implementation, the chassis 110 includes banks of hard disk drives (HDDs) 140 that are arranged in rows. However, according to other implementations, each of the HDDs 140 may be replaced by different types of memory, e.g., such as solid state drives (SSDs). Referring still to the present implementation, the HDDs 140 are further divided into two parallel banks of individual hard drives connected to a motherboard 120. More specifically, each bank is shown as having six rows of six individual hard drives 140 for a total of 72 HDDs. Each HDD 140 may be connected to the motherboard 120 across an electrically conductive interface, such that each HDD 140 is able to communicate with each other as well as other components in the storage server 100. It should also be noted that one or more storage control boards may be included in a housing between the two banks of individual HDDs 140.

As noted above, the front panel 122 includes two bays 150 that allow the insertion of I/O modules 160 of certain form factors. Each of the bays 150 allows access to an I/O module 160, e.g., such as an I/O module. As noted above, various high demand applications, such as network based systems, data centers, high density finite element simulations, etc., operate using servers having specialized capabilities. Accordingly, modern servers are typically designed to allow flexibility in terms of capabilities and components to allow for different applications to be supported depending on the implementation. I/O modules are able to provide some flexibility in this regard, as they allow for the capacity of a given storage server 100 to be tailored for a specific implementation.

It follows that I/O modules may be configured differently depending on the implementation. For instance, in some instances an I/O module includes an I/O board with a PCIe form factor that is configured to dock (e.g., couple) to a connector socket (e.g., see 226 of FIG. 2). In other instances, there may be a power button, reset button, debug USB components, various electrical connection interfaces, etc., located at a front face of the I/O module. Other types of computer devices such as application servers may have fewer storage devices and more bays for more expansion cards.

While these I/O modules desirably provide flexibility in terms of the capacity and functionality a given storage server has, it is important that the I/O modules themselves are securely coupled to the server to avoid issues arising from unintentional disconnects between various electrical components. For example, data loss, command failures, program interruptions, etc., may result from an I/O module being unintentionally undocked from a connector socket. However, it is also desirable that the I/O module itself is easily accessible. Accordingly, the I/O module may preferably be disconnected from the server chassis easily and quickly, even in situations involving limited space.

While conventional designs have been unable to achieve modules that provide easy access even in situations involving limited space, various ones of the implementations included herein are able to overcome these conventional shortcomings. For instance, by implementing fastening assemblies that can selectively secure and release I/O modules by rotating a fastener knob, implementations herein allow smooth access to I/O modules, even in the most spatially constricted situations, e.g., as will be described in further detail below.

Moreover, the various fastening assemblies included herein may be used in situations involving any suitable computer devices, e.g., such as storage devices (e.g., JBODs), switches, etc. Accordingly, the improvements achieved by implementing the fastening assemblies included herein extend to any implementation that would be apparent to one skilled in the art after reading the present description. It should also be noted that while only two bays 150 are provided, this is in no way intended to be limiting. Accordingly, any number of bays may be supported by different structures of the front panel 122, e.g., depending on the particular implementation.

Referring specifically now to FIG. 1B, the storage server 100 is illustrated as having released the I/O module 160 from the corresponding bay 150. As noted above, the I/O module 160 (e.g., I/O module) may be secured and released by rotating the fastener knobs 170 in a particular direction. Specifically, by rotating the fastener knobs 170 a thread mechanism and gear selectively engage a gear rack 172 coupled to the I/O module 160. As a result, the thread mechanism and gear transfer external rotational force applied to the fastener knobs 170. This external rotational force is transferred to the gear rack 172 and I/O module 160, such that the I/O module 160 is either pushed into or out of the corresponding bay 150. In other words, upon receiving an external rotational force, the thread mechanism causes (a) the gear to rotate and (b), in turn, linear movement of the gear rack to (c) secure or unsecure the I/O module relative to the computer chassis, e.g., as will soon become apparent.

FIG. 1C further illustrates the path of motion for an I/O module 160 from a bottom view of the storage server 100. As noted above, the I/O module 160 may be inserted into a bay 150 by freely sliding the I/O module 160 into the recess formed by the bay 150 until the gear rack (not shown) comes into contact with a gear of the fastening assembly. In some approaches, the bay 150 may include features, e.g., such as one or more rollers, that are configured to assist in facilitating motion of the I/O module 160 while being inserted into and/or being removed from a corresponding bay 150.

A connector socket 174 is also shown as being positioned proximal to a rear of the bay 150. The connector socket 174 interfaces with the I/O module 160 and may have varying form factors depending on the implementation. For example, the connector socket 174 may be a PCIe type socket that is attached to the bottom surface of the motherboard 120. Accordingly, the connector socket 174 may extend through the back, upper, side, or bottom surface(s) of the bay 150 in order to provide an electrical connection interface that allows for communication between components included in the I/O module 160 and those in the remainder of the storage server 100. Additional connecting sockets may also be present elsewhere in the I/O module 160. For example, the connecting sockets 176 depicted in FIG. 2 are configured to interface with the various HDDs 140 such that data operations, instructions, formatting commands, etc. may be sent to and received from each of the HDDs 140.

Figure 2:
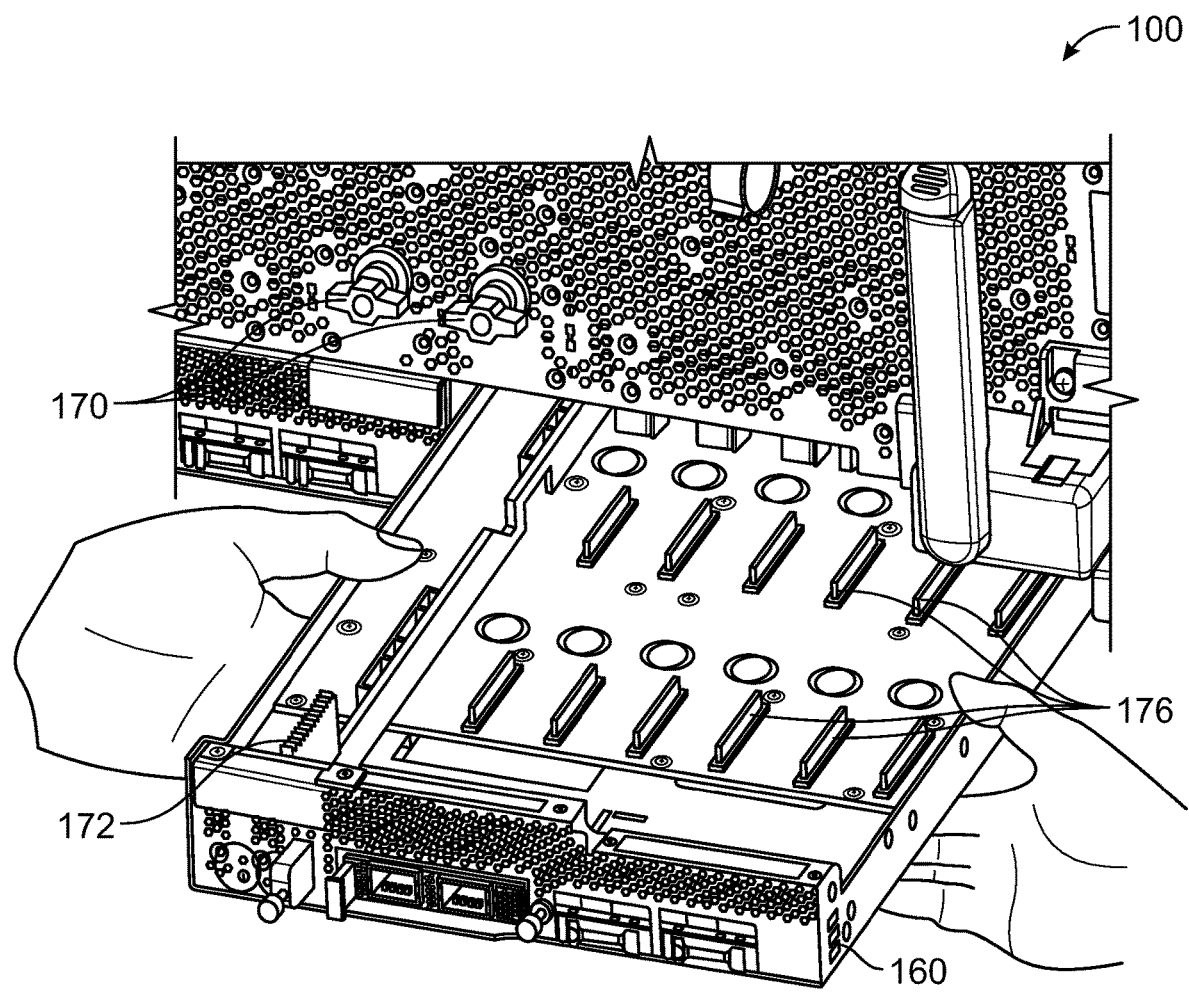
FIG. 2 is an isolated perspective view of the fastening assembly with an I/O module partially inserted in a bay of the computer system of FIG. 1A, according to aspects of the present disclosure.

Referring now to FIG. 2, a detailed view of the storage server 100 and corresponding I/O module 160 with the gear rack 172 are illustrated in accordance with one implementation. As an option, the present storage server 100 may be implemented in conjunction with features from any other embodiment listed herein, such as those described with reference to the other FIGS., such as FIGS. 1A-1C. However, such storage server 100 and others presented herein may be used in various applications and/or in permutations which may or may not be specifically described in the illustrative embodiments listed herein. Further, the storage server 100 presented herein may be used in any desired environment. Thus FIG. 2 (and the other FIGS.) may be deemed to include any possible permutation.

In FIG. 2 the I/O module 160 has been released from a secured position and is shown as partially removed from the corresponding bay 150 of the storage server 100. As noted above, the I/O module 160 may be slid in and out of the corresponding bay 150 in response to the gear rack 172 becoming decoupled from a corresponding fastening assembly. Accordingly, an external force applied to the I/O module 160, e.g., by a user, will cause the I/O module to slide into or out of the corresponding bay 150 in situations where the gear rack 172 is not coupled to the fastening assembly.

Once released from being secured in a bay 150, an I/O module 160 may be fully removed from the bay 150, e.g., such that the I/O module 160 may be modified, replaced, inspected, etc. For instance, I/O modules having compatible card form factors may be inserted for installation in the storage server 100. The I/O module 160 may then be moved to a secured (e.g., closed) position by rotating the fastener knob 170. In the secured position, the I/O module 160 may be connected to the motherboard 120 and desirably provide additional functionality to the storage server 100.

As noted above, the rotatable fastener knobs 170 are rotatably fixed to a remainder of the fastening assembly (not shown). Accordingly, rotating the fastener knobs 170 causes portions of the fastening assembly to become coupled to or decoupled (e.g., released) from the gear rack 172. For instance, referring now to FIGS. 3A-3B, the fastening assembly 300 is shown as having released the gear rack 172, in accordance with one embodiment. In other words, the I/O module 160 is shown in an unsecured (e.g., "released") position where the gear rack 172 is not engaged with the gear 310. Thus, the I/O module 160 is free to slide in and out of the bay 150 in response to an external force being applied thereto.

As an option, the present fastening assembly 300 may be implemented in conjunction with features from any other embodiment listed herein, such as those described with reference to the other FIGS., such as FIG. 2. Accordingly, the fastening assembly 300 may be for securing an I/O module to a computer device chassis. However, such fastening assembly 300 and others presented herein may be used in various applications and/or in permutations which may or may not be specifically described in the illustrative embodiments listed herein. Further, the fastening assembly 300 presented herein may be used in any desired environment. Thus FIGS. 3A-3B (and the other FIGS.) may be deemed to include any possible permutation.

The fastening assembly 300 is shown as including rotatable fastener knobs 170. Each of the rotatable fastener knobs 170 is rotatable in both the clockwise and counterclockwise directions. The fastener knobs 170 are also shown as having protrusions (e.g., arms) extending away from the axis of rotation. These protrusions may assist in applying an external rotational force to the actual fastener knobs 170. It follows that depending on the desired implementation, the fastener knobs 170 may include any type of texturing, geometric patterns, shapes, materials, etc. For instance, the fastener knobs 170 may include features and/or characteristics that are designed to efficiently implement a rotational external force applied thereto.

Figure 3A:
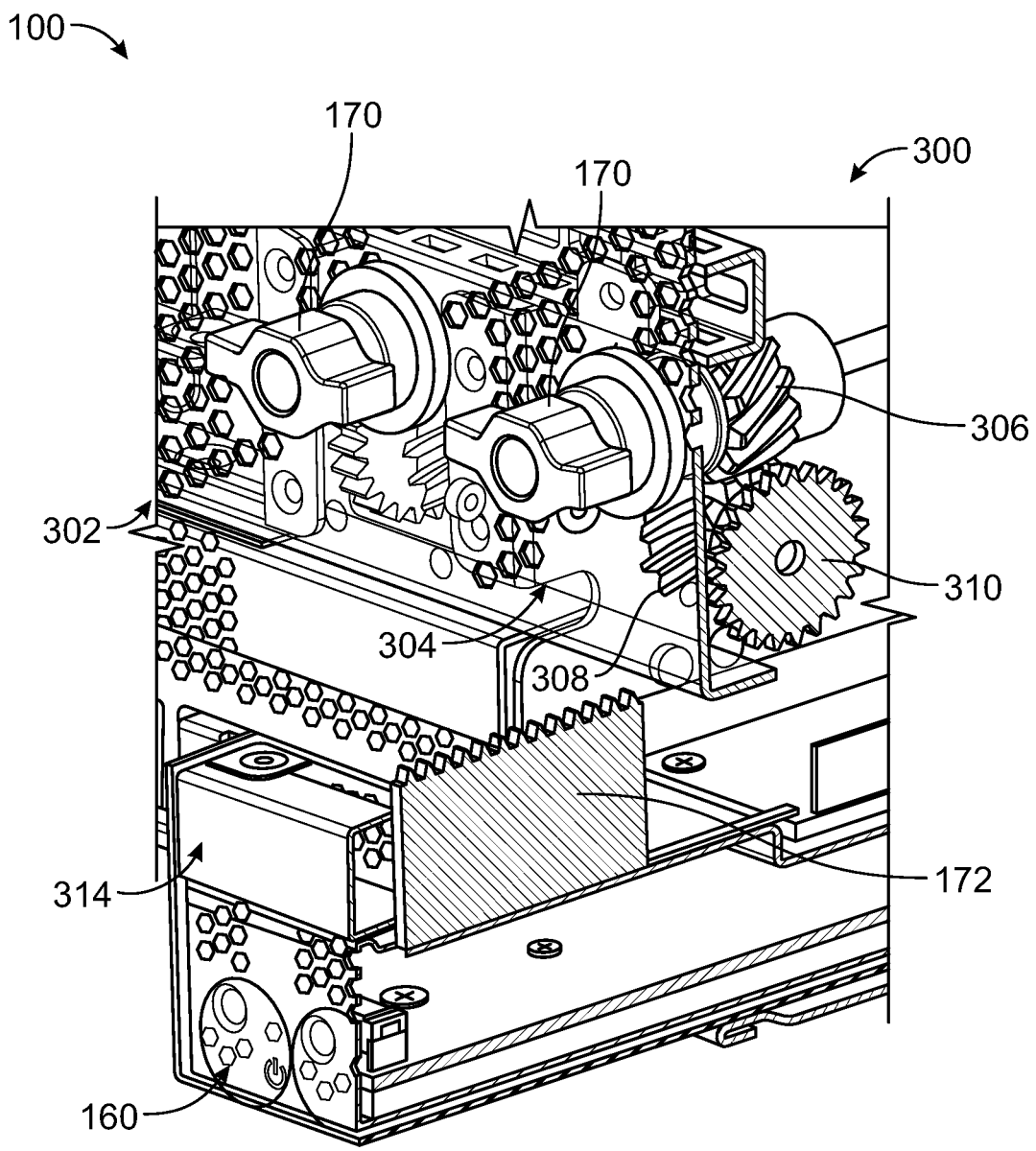
FIG. 3A is an isolated cross-sectional and perspective view of a fastening assembly, according to aspects of the present disclosure.
Figure 3B:
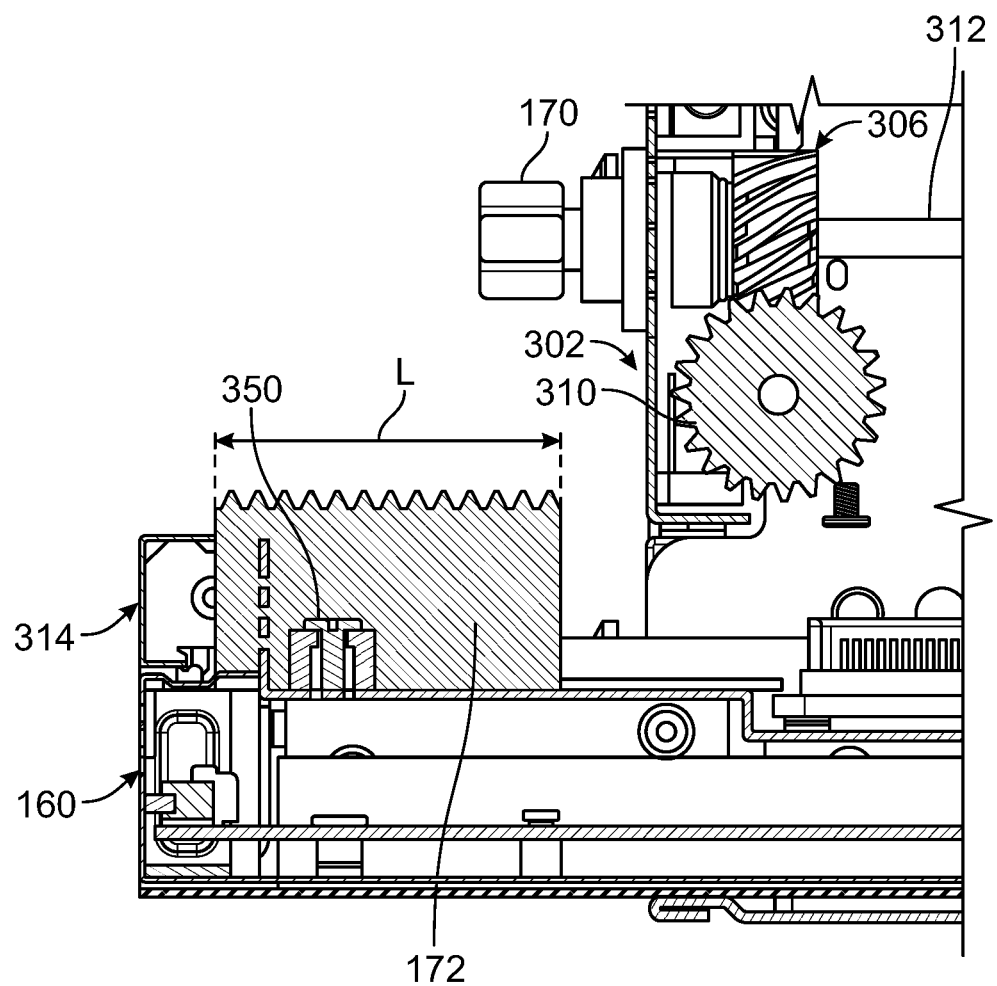
FIG. 3B is an isolated cross-sectional side view of the fastening assembly, according to aspects of the present disclosure.

As shown in both FIGS. 3A-3B, the fastener knobs 170 are coupled to an exterior face 302 of the chassis. The fastener knobs 170 are thereby accessible at an exterior of the storage server 100 chassis, e.g., such that the fastener knobs 170 can be rotated to couple or release the I/O module 160 from the fastening assembly 300, e.g., as will become apparent.

Each fastener knob 170 is further rotatably fixed to a thread mechanism 304 having first and second portions 306, 308. According to the present implementation, the thread mechanism 304 is a screw gear, where the first and second portions 306, 308 are configured to rotate in different directions. In other words, the axis of rotation for the first portion 306 is perpendicular to the axis of rotation for the second portion 308. These perpendicular axes of rotation are possible due to the angled teeth of the first and second portions 306, 308 that are configured to engage each other when the portions are positioned perpendicular to each other (e.g., as seen in FIG. 3A). However, it should be noted that any desired type of gear mechanism may be used for the thread mechanism 304. For instance, depending on the desired implementation, the first and second portions 306, 308 of the thread mechanism 304 may be beveled gears, miter gears, worm gears, etc.

Referring still to FIGS. 3A-3B, the fastener knob 170 is rotatably fixed to the first portion 306 of the thread mechanism 304, such that the first portion 306 rotates along with the fastener knob 170. In other words, applying an external rotational force that causes the fastener knob 170 to rotate in the clockwise direction, also causes the first portion 306 of the thread mechanism 304 to rotate in the clockwise direction. Similarly, rotating the fastener knob 170 in the counterclockwise direction causes the first portion 306 of the thread mechanism 304 to rotate in the counterclockwise direction as well. However, in other implementations the first portion 306 may be configured to rotate in an opposite direction as the corresponding fastener knob 170.

Moreover, the second portion 308 of the thread mechanism 304 is rotatably fixed to a gear 310. Thus, causing the first portion 306 of the of the thread mechanism 304 to rotate, will in turn cause the second portion 308 of the thread mechanism 304 and the corresponding gear 310 to rotate as well. As noted above, it is preferred that gear 310 rotates in a same direction as the second portion 308 of the thread mechanism 304, but the two components may be configured to rotate together in opposite directions in some approaches. A shaft 312 of the thread mechanism 304 further extends to a support in the computer device chassis. For example, the shaft 312 of the thread mechanism 304 may extend to a back surface (e.g., wall) of the computer device chassis to provide support and stability to the fastening assembly 300, e.g., as would be appreciated by one skilled in the art after reading the present description.

The gear 310 is further configured to engage the gear rack 172. For instance, patterned features (e.g., teeth) of the gear 310 are configured to engage corresponding patterned features (e.g., teeth) of the gear rack 172. It follows that the patterned features of the gear rack 172 and gear 310 preferably have a corresponding design. The teeth of the gear rack 172 may thereby begin to engage the teeth of the gear 310 in response to the I/O module 160 being inserted into the corresponding bay 150 sufficiently to cause the gear rack 172 to come into contact with the gear 310. Furthermore, by rotating the fastener knob 170 in response to the teeth of the gear rack 172 contacting (e.g., beginning to engage) the teeth of the gear 310, the gear rack 172 and gear 310 become fully engaged.

It follows that, while the gear is not engaged with the gear rack, the I/O module 160 is able to slide in and out of a bay in the chassis in response to external linear forces being applied thereto. For example, a user can freely slide the I/O module 160 out of a bay when the gear 310 and gear rack 172 are not engaged (e.g., see FIG. 2). However, in situations where the gear 310 and gear rack 172 are engaged, external linear forces applied to the I/O module 160 are unable to cause it to move in the bay. This is because the gear 310 and thread mechanism 304 are configured to prevent the I/O module 160 from sliding in and out of the bay while the gear 310 is engaged with the gear rack 172.

Figure 4A:
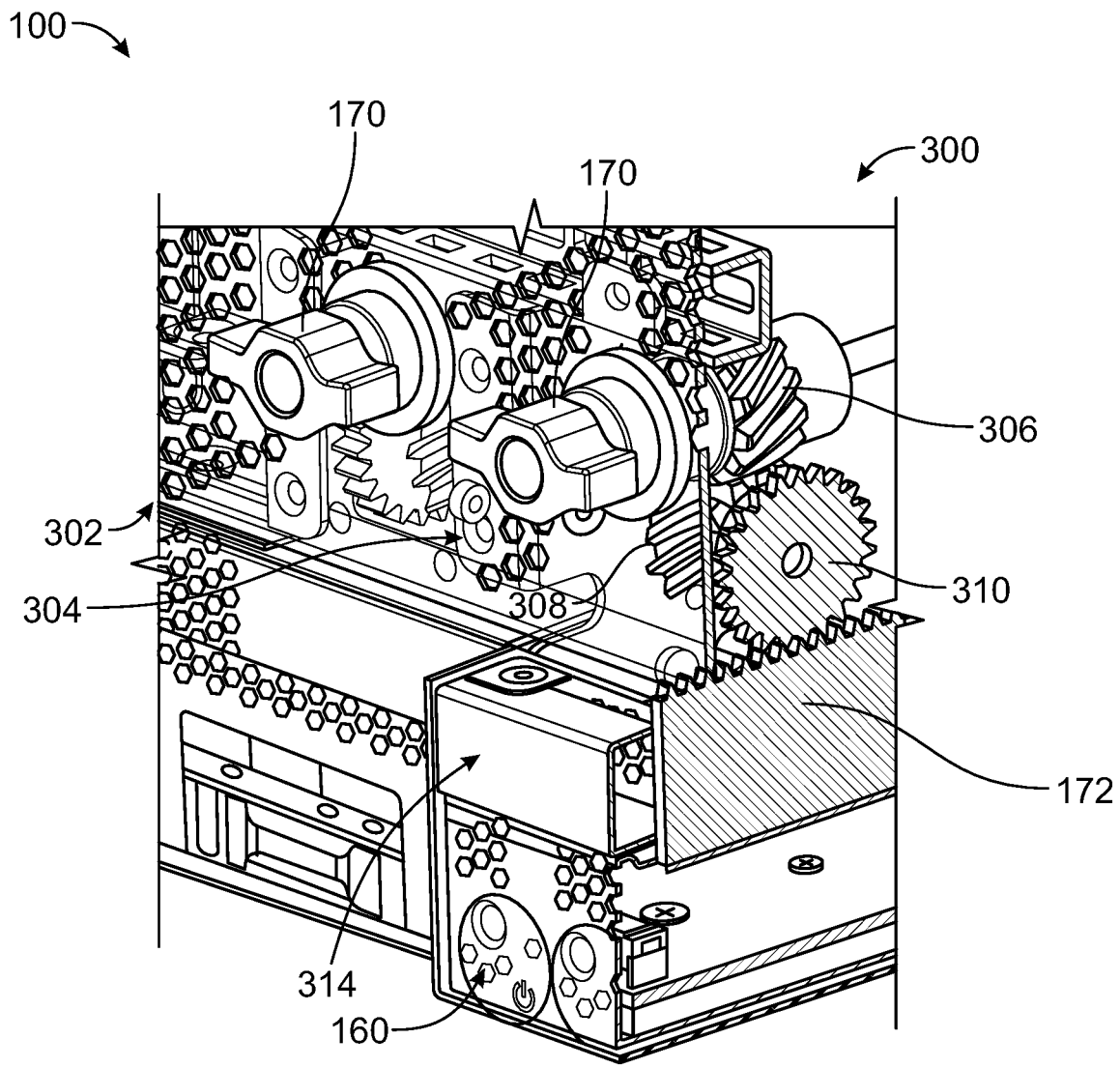
FIG. 4A is an isolated cross-sectional and perspective view of the fastening assembly, according to aspects of the present disclosure.
Figure 4B:
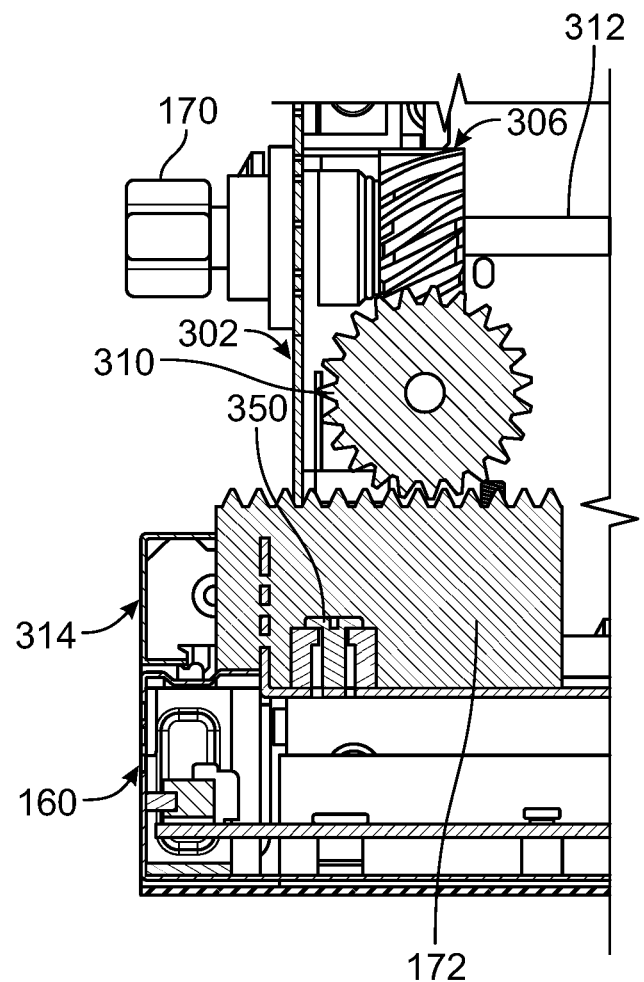
FIG. 4B is an isolated cross-sectional side view of the fastening assembly, according to aspects of the present disclosure.

Looking specifically now to FIGS. 4A-4B, the I/O module 160 is shown between an unsecured position and a secured position. Specifically, teeth of the gear rack 172 are shown as being fully engaged with the teeth of the gear 310, but not to the extent that the I/O module 160 is fully inserted into the bay. Again, as the fastener knob 170 is rotated by an external rotational force, the thread mechanism 304 is configured to transfer the rotational force to the gear rack 172 via the gear 310 such that the I/O module 160 moves linearly along the length of the bay 150. In other words, the fastening assembly 300 is configured to move the I/O module 160 into and out of the bay as a result of rotating the fastener knob 170. However, attempts to push the I/O module 160 into the bay and/or pull the I/O module 160 out of the bay while the gear rack 172 and gear 310 are engaged are not able to force the components of the fastening assembly 300 to move and interact with each other. Thus, while the gear rack 172 and gear 310 are engaged, the fastener knob 170 is rotated in order to move the I/O module 160 into and out of the bay as desired.

Figure 5A:
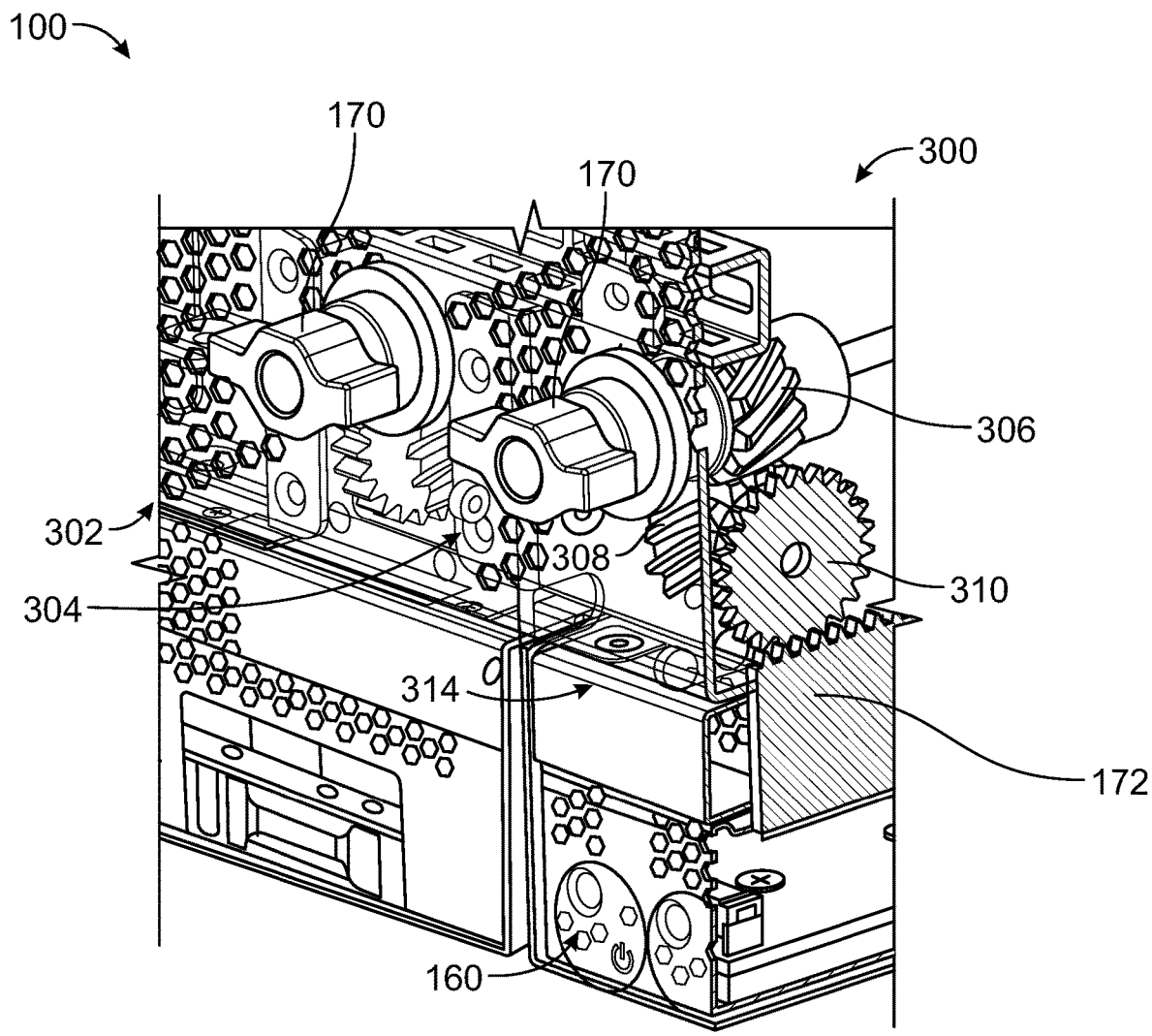
FIG. 5A is an isolated cross-sectional and perspective view of the fastening assembly, according to aspects of the present disclosure.
Figure 5B:
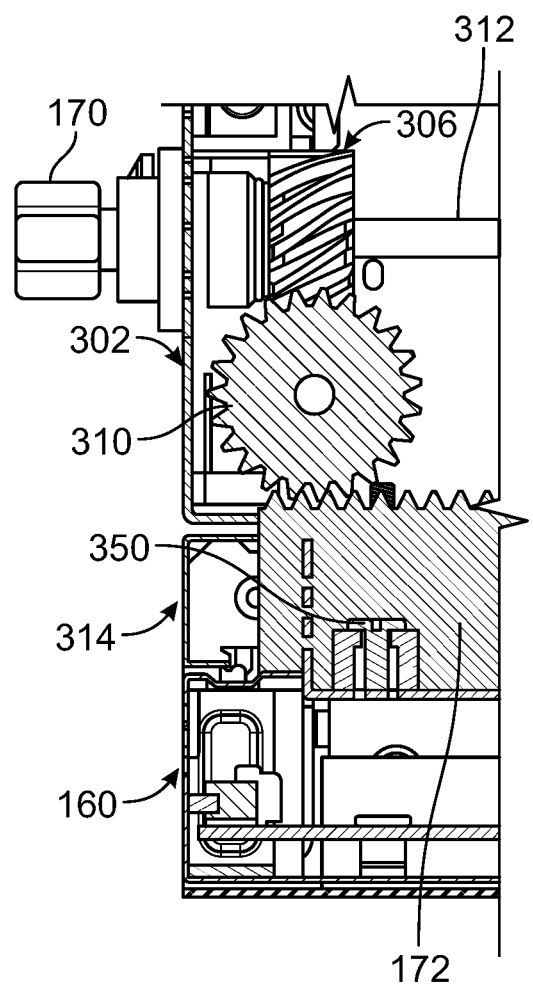
FIG. 5B is an isolated cross-sectional side view of the fastening assembly, according to aspects of the present disclosure.

FIGS. 5A-5B further illustrate the I/O module 160 in a secured position. Specifically, teeth of the gear 310 are shown as having advanced to an end of the gear rack 172 such that the I/O module 160 is fully inserted into the bay. As shown, a face 314 of the I/O module 160 is flush with the exterior face 302 of the chassis. However, in other approaches the face 314 of the I/O module 160 may be recessed relative to the exterior face 302 of the chassis. In still other approaches, the exterior face 302 of the chassis may be recessed relative to the face 314 of the I/O module 160. It follows that the specific position of the I/O module 160 in the secured position may vary depending on the size, form factor, components, etc., of the I/O module 160 and/or the bay it is secured in. For instance, one or more surfaces of the I/O module 160 may also be in contact with physical bumpers that assist in locking the I/O module 160 while in the secured position.

Referring again to FIGS. 3A-5B, in some implementations the thread mechanism 304 is configured to transfer a clockwise rotational force to the gear rack 172 via the thread mechanism 304 and gear 310 such that the I/O module 160 moves linearly into the bay, and transfer a counterclockwise rotational force to the gear rack 172 via the thread mechanism 304 and gear 310 such that the I/O module 160 moves further out of the bay. In other implementations, the thread mechanism 304 is configured to transfer a clockwise rotational force to the gear rack 172 via the thread mechanism 304 and gear 310 such that the I/O module 160 moves further out of the bay, and transfer a counterclockwise rotational force to the gear rack 172 via the thread mechanism 304 and gear 310 such that the I/O module 160 moves linearly into the bay. Accordingly, rotating the fastener knob 170 in opposite directions causes the I/O module 160 to move laterally in opposite and parallel directions.

It should also be noted that the I/O module 160 is illustrated as moving in directions that are perpendicular to the plane of rotation for the fastener knob 170. In other words, the fastener knob 170 rotates in a plane that is perpendicular to the directions in which the I/O module 160 moves while being inserted and removed from the bay 150 in the computer device chassis. However, this configuration is in no way intended to be limiting. For instance, the fastener knob 170 may be configured to rotate along a different plane, be positioned differently relative to the I/O module (e.g., on a side of the computer device chassis), etc. Moreover, the thread mechanism may include different types of gear mechanisms, e.g., such as beveled gears, miter gears, worm gears, etc., that affect the plane of rotation for the first and/or second portions 306, 308 of the thread mechanism 304.

The teeth of the gear rack 172 also preferably align with teeth of the gear 310 along multiple axes to ensure the gear 310 of the fastening assembly 300 is able to engage the gear rack 172. Accordingly, the gear 310 may be positioned such that a portion of the gear 310 extends down into the bay in order to engage an upper portion of the gear rack 172. As noted above, the gear rack 172 is coupled to the I/O module 160, and may thereby not extend past an upper surface of the bay to ensure the I/O module 160 is actually able to fit in the bay. Thus, by lowering the gear 310, teeth of the gear 310 are in a position to engage the teeth of the gear rack 172.

Dimensions of the gear rack 172 may also vary depending on the approach. For instance, the size, number, shape, etc., of the teeth in the gear rack 172 may differ. However, it is preferred that the teeth of the gear rack 172 can engage (are compatible with) the teeth of the gear 310. A length (see "L" of FIG. 3B) of the gear rack 172 determines the distance the I/O module 160 travels between the secured and unsecured positions. In other words, the longer the gear rack 172 is, the greater distance the I/O module 160 travels before the gear 310 becomes disengaged from the gear rack 172. This in turn will impact the number of rotations the fastener knobs 170 are rotated to transition between secured and unsecured positions of the I/O module 160. According to some approaches, the length of the gear rack 172 is between about 2 centimeters and about 15 centimeters, more preferably between about 1 centimeter and about 25 centimeters, but could be longer or shorter depending on the desired approach.

The gear rack 172 may also be coupled to the I/O module 160 in any desired manner. For example, the gear rack 172 is illustrated in the partial side-views of FIGS. 3B and 4B as being coupled to a remainder of the I/O module 160 by a fastener 350. The fastener 350 may be of any type (e.g., include any desired type of material), and is in no way intended to limit the invention. For example, the gear rack 172 may be coupled to the I/O module 160 using one or more adhesives, clips, contact points (e.g., spot welding), etc. However, it is preferred that the gear rack 172 is coupled to the I/O module 160 sufficiently such that external rotational force applied to the fastener knob 170 is transferred to the I/O module 160 by the thread mechanism 304 and gear 310, such that the I/O module 160 moves into and out of the bay in the computer device chassis.

Again, portions of the thread mechanism 304 are rotatably fixed to the fastener knob 170 and the gear 310. It follows that the thread mechanism 304 is configured to transfer external rotational force applied to the fastener knob in the clockwise direction to the gear rack via the gear such that the I/O module moves linearly in a first direction.

It should also be noted that any one of the components included in a fastening assembly as described herein may be formed using any desired type of material(s). For example, the gear rack, gear, thread mechanism, etc., may include one or more metals, plastics, etc., depending on the desired implementation.

It follows that various ones of the approaches included herein are able to efficiently service the expansion components that are included in I/O modules, e.g., such as an expansion card installed in a tray of the I/O module. Moreover, the I/O modules may be installed in limited available space, e.g., on the side wall of a bay in the chassis. The fastening assembly allows for a simplified design that involves using a rotating fastener knob to secure and release the mating features (e.g., teeth of a gear) of the I/O module 160 with the mating features (e.g., teeth) of the gear rack 172. The fastening assemblies described herein also do not involve using specialized tools to fix the I/O module 160 in place in the bay 150. Similarly, specialized tools are not involved while accessing the I/O module 160. Rather, the fastener knobs 170 may be rotated by a user (e.g., using their fingers to do so) in order to secure and release the I/O module 160.

Figure 6A:
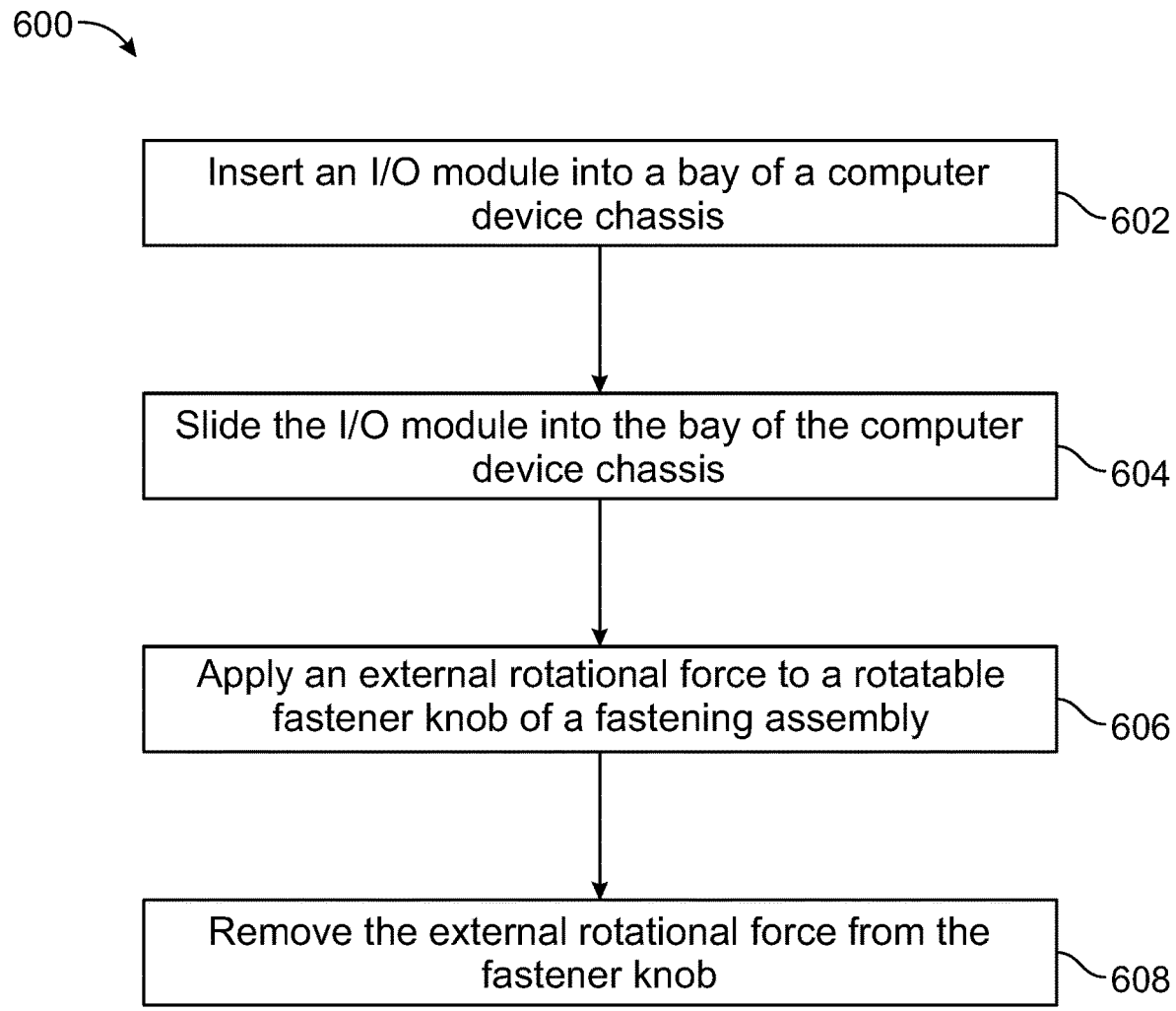
FIG. 6A is a flowchart of a method for inserting an I/O module into a bay, according to aspects of the present disclosure.
Figure 6B:
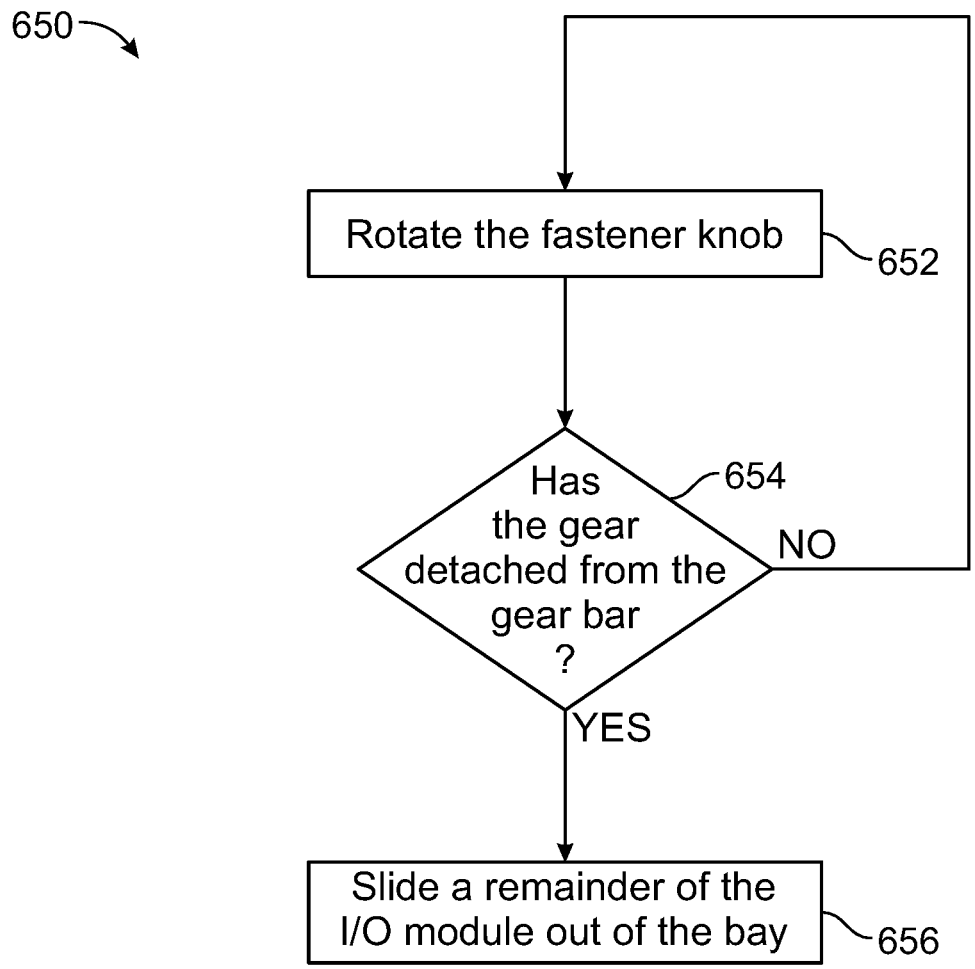
FIG. 6B is a flowchart of a method for removing an I/O module from a bay, according to aspects of the present disclosure.

For instance, referring now to FIGS. 6A-6B, flowcharts of methods for inserting (e.g., method 600) an I/O module and removing (e.g., method 650) an I/O module, such as the I/O module 160 discussed above, are shown according to two implementations. The methods 600, 650 may be performed in accordance with the present invention in any of the environments depicted in FIGS. 1-5B, among others, in various embodiments. Of course, more or less operations than those specifically described may be included in methods 600, 650, as would be understood by one of skill in the art upon reading the present descriptions.

Each of the steps of the methods 600, 650 may be performed by any suitable component of the operating environment using known techniques and/or techniques that would become readily apparent to one skilled in the art upon reading the present disclosure. For example, in various embodiments, either method 600, 650 may be partially or entirely performed by a controller, a processor, etc., or some other device having one or more processors therein. The processor, e.g., processing circuit(s), chip(s), and/or module (s) implemented in hardware and/or software, and preferably having at least one hardware component may be utilized in any device to perform one or more steps of the methods 600, 650. Illustrative processors include, but are not limited to, a central processing unit (CPU), an application specific integrated circuit (ASIC), a field programmable gate array (FPGA), etc., combinations thereof, or any other suitable computing device known in the art.

Looking first to FIG. 6A, operation 602 includes inserting an I/O module into a bay of a computer device chassis. The I/O module may be inserted into the bay by a user using their hands to lift and move the I/O module as desired in some implementations. However, any desired lifting mechanisms, trays, automated grippers, etc. may be used to actually insert the I/O module in other implementations, e.g., where the I/O module is too heavy for a user to lift and move with accuracy.

From operation 602, method 600 proceeds to operation 604. There, operation 604 includes sliding the I/O module into the bay of the computer device chassis. The I/O module is preferably slid into the bay sufficiently far such that a gear rack coupled to the I/O module itself, comes into contact with a gear in the bay. As previously mentioned, at least a portion of the gear may extend down into the bay such that the gear rack is able to come into contact with the gear.

In response to the I/O module being inserted to the point that the gear rack comes into contact with the gear, operation 606 includes applying an external rotational force to a rotatable fastener knob of a fastening assembly. While rotating the fastener knob, the fastening assembly becomes activated and begins also rotating the gear in contact with the gear rack. As a result, the fastening assembly is able to transfer the external rotational force to the gear rack and I/O module, thereby causing the I/O module to move further into the bay. It should be noted that while the external rotational force may be applied by a user's hand twisting the fastener knob, the rotational force may be applied by other sources. For example, a rotating electromechanical device may be used to actually generate the external rotational force that is selectively applied to the fastener knob.

Operation 606 preferably includes applying the external rotational force to the rotatable fastener knob until the I/O module has reached a secured position in the bay. Once in the secured position, the fastener knob may no longer be rotatable in the direction used to reach the secured position. Accordingly, operation 608 includes removing the external rotational force from the fastener knob. This may be caused by the gear of the fastening assembly reaching an end of the gear bar.

Referring now to FIG. 6B, a method 650 for removing an I/O module from a bay in a computer device chassis is illustrated according to an implementation. As shown, operation 652 includes rotating the fastener knob. The fastener knob is preferably rotated in an opposite direction as was used to insert the I/O module in the bay. The fastener knob is also rotated until the gear becomes detached (e.g., decoupled) from the gear bar. See decision 654. In response to determining that the gear has not yet been detached from the gear bar, method 650 returns to operation 652 such that the fastener knob may continue to be rotated.

However, in response to determining that the gear has detached from the gear bar, method 650 proceeds to operation 656. There, operation 656 includes sliding a remainder of the I/O module out of the bay. Once removed, the I/O module may be accessed (e.g., to repair various components included therein), replaced, inspected, etc. Again, various ones of the implementations included herein are desirably able to easily secure and release I/O modules from computer chassis.

It should be noted that, while various aspects of the implementations herein have been illustrated as including specific designs, orientations, numbers of components, etc., this is in no way intended to limit the invention. Rather, the implementations herein are presented for exemplary purposes only and may vary in design, orientation, number of components, etc., depending on the desired approach. It should also be noted that use of the terms "bottom", "lower", "top", "upper", etc., are in no way intended to be limiting. Any frames of reference used to describe the various implementations herein have been selected for illustrative purposes only and may be adjusted as desired.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A computing system comprising:
an input/output (I/O) module securable to a computer chassis, the I/O module having a gear rack, the I/O module being movable in a translational direction relative to the computer chassis; and
a fastening assembly including:
a fastener configured to receive an external rotational force from a user;
a thread mechanism having first and second portions, the first portion of the thread mechanism being rotatably fixed to the fastener, the first portion having a first axis of rotation; and
a gear rotatably fixed to the second portion of the thread mechanism, the gear having a second axis of rotation that is generally perpendicular to the first axis of rotation, the gear being configured to engage the gear rack,
wherein, upon receiving the external rotational force, the thread mechanism causes (a) the gear to rotate and (b), in turn, linear movement of the gear rack to (c) secure or unsecure the I/O module relative to the computer chassis.

2. The computing system of claim 1, wherein the fastener is configured to be rotated in a clockwise direction and a counterclockwise direction.

3. The computing system of claim 2, wherein the thread mechanism is configured to transfer the external rotational force such that the I/O module moves linearly in a first direction in which the I/O module is secured relative to the computer chassis.

4. The computing system of claim 3, wherein the thread mechanism is configured to transfer the external rotational force such that the I/O module moves linearly in a second direction in which the I/O module is unsecured relative to the computer chassis.

5. The computing system of claim 4, wherein the first direction is opposite and parallel to the second direction.

6. The computing system of claim 4, wherein the first and second directions are perpendicular to a plane of rotation of the fastener.

7. The computing system of claim 1, wherein patterned features of the gear are configured to engage corresponding patterned features of the gear rack.

8. The computing system of claim 1, wherein a length of the gear rack is between about 2 centimeters and about 15 centimeters.

9. The computing system of claim 1, wherein the fastener is rotatably fixed to an exterior of the chassis.

10. The computing system of claim 1, wherein the I/O module is configured to slide in and out of a bay in the chassis in response to external linear force being applied to the I/O module while the gear is not engaged with the gear rack.

11. The computing system of claim 10, wherein the gear and thread mechanism are configured to prevent the I/O module from sliding in and out of the bay in the chassis in response to external linear forces being applied to the I/O module while the gear is engaged with the gear rack.

12. A system comprising:
    a computer chassis having bays, each bay configured to receive and secure an input/output (I/O) module having a gear rack; and
    fastening assemblies, each fastening assembly including:
        a fastener configured to receive an external rotational force from a user;
        a thread mechanism having first and second portions, the first portion of the thread mechanism being rotatably fixed to the fastener, the first portion having a first axis of rotation; and
        a gear rotatably fixed to the second portion of the thread mechanism, the gear having a second axis of rotation that is generally perpendicular to the first axis of rotation, the gear being configured to engage the gear rack,
    wherein, upon receiving the external rotational force, the thread mechanism causes (a) the gear to rotate and (b), in turn, linear movement of the gear rack to (c) secure or unsecure the I/O module relative to the computer chassis.

13. The system of claim 12, wherein the fastener is configured to be rotated in a clockwise direction and a counterclockwise direction.

14. The system of claim 13, wherein the thread mechanism is configured to transfer the external rotational force such that the I/O module moves linearly in a first direction in which the I/O module is secured relative to the computer chassis.

15. The system of claim 14, wherein the thread mechanism is configured to transfer the external rotational force such that the I/O module moves linearly in a second direction in which the I/O module is unsecured relative to the computer chassis.

16. The system of claim 15, wherein the first direction is opposite and parallel to the second direction, wherein the first and second directions are perpendicular to a plane of rotation of the fastener.

17. The system of claim 12, wherein the I/O module is configured to slide in and out of one of the bays in the chassis in response to external linear force being applied to the I/O module while the gear is not engaged with the gear rack, wherein the gear and thread mechanism are configured to prevent the I/O module from sliding in and out of the one of the bays in response to external linear forces being applied to the I/O module while the gear is engaged with the gear rack.

18. The system of claim 17, wherein a portion of the gear extends into the one of the bays in the chassis.

19. A method of securing an input/output (I/O) module in a bay of a computer chassis, the method comprising:
    inserting the I/O module in the bay of the chassis such that a gear rack coupled to the I/O module comes into contact with a gear, the gear being configured to engage the gear rack, wherein the I/O module is movable in a translational direction along the bay relative to the computer chassis;
    applying an external rotational force to a fastener, the fastener being rotatably fixed to a first portion of a thread mechanism, the first portion having a first axis of rotation, wherein a second portion of the thread mechanism is rotatably fixed to the gear, the gear having a second axis of rotation that is generally perpendicular to the first axis of rotation, wherein, upon receiving the external rotational force, the thread mechanism causes (a) the gear to rotate and (b), in turn, linear movement of the gear rack to (c) secure or unsecure the I/O module relative to the computer chassis; and
    removing the external rotational force from the fastener in response to the I/O module being secured.

20. The method of claim 19, wherein a face of the I/O module is flush with a face of the chassis while the I/O module is secured to the chassis.

* * * * *